United States Patent
Fesler et al.

(10) Patent No.: US 11,290,090 B2
(45) Date of Patent: Mar. 29, 2022

(54) EXTENDING ON-TIME FOR POWER CONVERTER CONTROL

(71) Applicant: Silanna Asia Pte Ltd, Singapore (SG)

(72) Inventors: Robert Eric Fesler, Raleigh, NC (US); William E. Rader, III, Carrboro, NC (US); Yashovardhan R. Potlapalli, Cary, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 17/247,536

(22) Filed: Dec. 15, 2020

(65) Prior Publication Data

US 2021/0257998 A1    Aug. 19, 2021

Related U.S. Application Data

(60) Provisional application No. 62/976,171, filed on Feb. 13, 2020.

(51) Int. Cl.
*H03K 3/017* (2006.01)
*H02M 1/088* (2006.01)

(52) U.S. Cl.
CPC ............ *H03K 3/017* (2013.01); *H02M 1/088* (2013.01)

(58) Field of Classification Search
CPC ........ H02M 1/08; H02M 1/088; H02M 1/096; H03K 3/02; H03K 3/53; H03K 3/57
See application file for complete search history.

(56) References Cited

U.S. PATENT DOCUMENTS

| 10,020,732 | B2 * | 7/2018 | Arbetter ................. H02M 1/08 |
| 2008/0088284 | A1 * | 4/2008 | Weng ................. H02M 3/1563 323/271 |
| 2009/0303766 | A1 | 12/2009 | Park et al. |
| 2012/0043951 | A1 | 2/2012 | Kuo et al. |
| 2013/0241511 | A1 | 9/2013 | Xi |
| 2015/0280556 | A1 | 10/2015 | Bari et al. |
| 2016/0118881 | A1 | 4/2016 | Schmitz et al. |
| 2018/0358899 | A1 | 12/2018 | Agostinelli et al. |

* cited by examiner

*Primary Examiner* — Diana J. Cheng
(74) *Attorney, Agent, or Firm* — MLO, a professional corp.

(57) ABSTRACT

A power transistor is switched on and off with an on-time that is held constant and an off-time that is varied. When the off-time is detected to be less than a threshold value that is greater than a minimum off-time limit, the on-time is extended. Then the power transistor is switched on and off with the extended on-time that is held constant and the off-time that varies.

20 Claims, 3 Drawing Sheets

EXTENDING ON-TIME FOR POWER CONVERTER CONTROL

RELATED APPLICATIONS

This application claims priority to U.S. Provisional Patent Application No. 62/976,171 filed on Feb. 13, 2020, and entitled "Extending On-Time for Power Converter Control," which is hereby incorporated by reference for all purposes.

BACKGROUND

Power converters generally produce a regulated output voltage Vout from a received input voltage Vin. In applications, like USB-PD (Universal Serial Bus-Power Delivery), where a variety of loads need to be driven across complicated power distribution networks with fast changing load transient profiles and a wide range of the input voltage Vin and the output voltage Vout, a constant on-time control architecture can be useful to achieve fast load transient response with relatively simple compensation. Constant on-time architectures generally have a duty cycle that is determined by the on-time divided by a sum of the on-time plus a variable off-time. The lowest value of the off-time is generally limited by a minimum off-time that is needed to ensure that any decisions made during the off-time have an adequately stable control signal and sufficient time to make a correct decision. Therefore, a constant on-time with a minimum off-time results in a maximum duty cycle, which limits the maximum output voltage Vout that can be regulated for any given input voltage Vin. The minimum off-time, thus, poses potential problems for adequate voltage regulation in some applications, so variation of the off-time must not result in the off-time dropping below the minimum, thereby risking inadequate control stability or insufficient time for making correct decisions during the off-time, among other potential problems.

SUMMARY

An improved electronic circuit or method generally includes a power transistor that is switched on and off with an on-time that is held constant and an off-time that is varied. When the off-time is detected to be less than a threshold value that is greater than a minimum off-time limit, the on-time is extended. Then the power transistor is switched on and off with the extended on-time that is held constant and the off-time that varies.

In some embodiments, as the off-time is repeatedly detected to be less than the threshold value, the on-time is repeatedly extended. In some embodiments, the off-time is detected to be less than the threshold value by detecting that an on-time start signal (indicating a start of the on-time) occurs within a predetermined time limit after the minimum off-time limit. In some embodiments, the extended on-time is maintained when the on-time start signal occurs within a second predetermined time limit after the predetermined time limit, and the extended on-time is decreased when the on-time start signal occurs after the second predetermined time limit. In some embodiments, the on-time is extended upon detecting that the off-time is less than the threshold value for a predetermined number of consecutive periods of a switching signal (e.g., a PWM signal) that switches the power transistor on and off. In some embodiments, the extended on-time is decreased in response to detecting that the off-time is greater than a second threshold value for the predetermined number of consecutive periods of the switching signal, the second threshold value being greater than the first threshold value.

DETAILED DESCRIPTION

Figure 1:
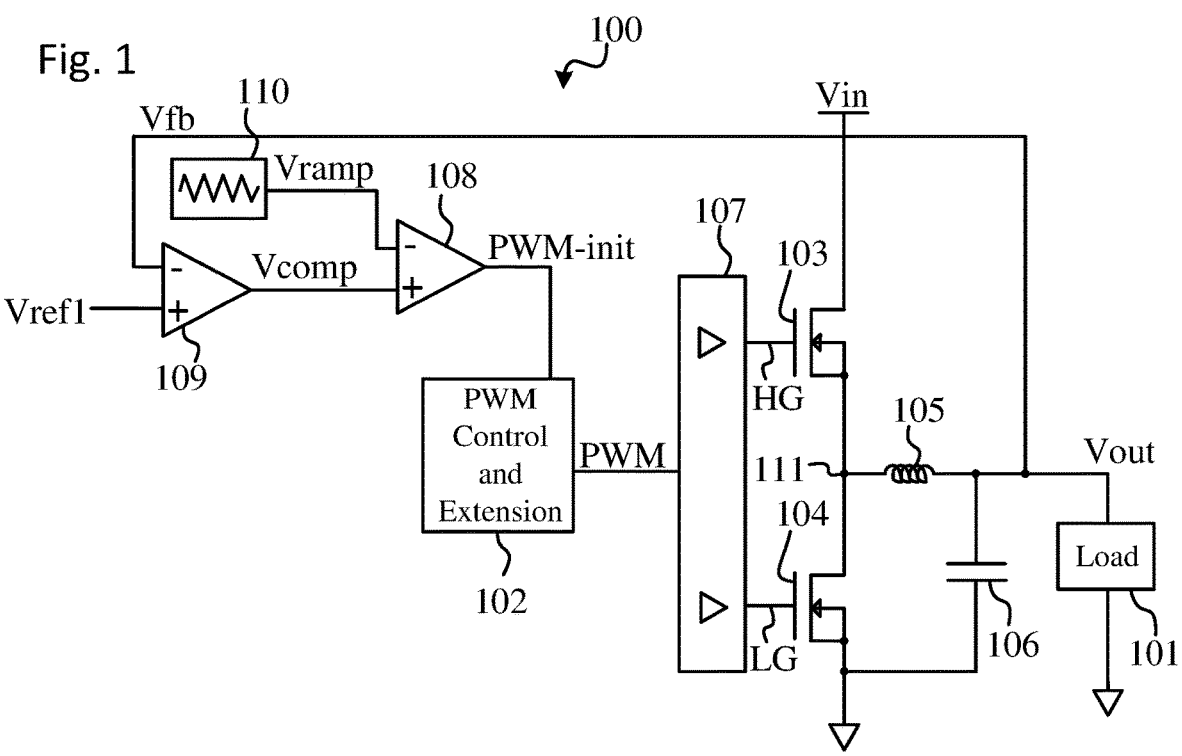
FIG. 1 is a simplified schematic diagram of a power converter having pulse width modulation (PWM) signal extension capabilities, in accordance with some embodiments.

FIG. 1 shows a simplified schematic diagram of a power converter 100 for providing electrical power to a load circuit 101 and that has a PWM (pulse width modulation) extension circuit 102 (i.e., a PWM signal generator) that generates a PWM signal (a switching signal) by holding the on-time constant and varying the off-time. Additionally, the PWM control and extension circuit 102 extends the on-time of the PWM signal when the off-time thereof approaches a minimum allowed off-time, but before the off-time reaches or falls below the minimum off-time, thereby allowing the off-time to be increased as well. There is, thus, a safety buffer between the point at which the PWM control and extension circuit 102 extends the on-time of the PWM signal and the minimum allowable off-time. This feature is distinguished from a prior art system that does not include such a safety buffer, and instead does not extend the on-time until the off-time reaches the minimum off-time. Since the safety buffer in the present disclosure prevents the off-time from inadvertently reaching or falling below the minimum off-time, any potential problems associated with inadequate control stability or insufficient time for making correct decisions during the off-time, among other potential problems, are avoided.

In addition to the PWM control and extension circuit 102, the power converter 100 generally includes a control switch 103, a synchronous switch 104, an output inductor 105, an output capacitor 106, a drive circuit 107, a PWM comparator (initial PWM signal generator) 108, a feedback error amplifier 109, and a voltage ramp signal source 110, among other components not shown for simplicity. Alternatively, in some embodiments, different components or combinations of components can be used to perform generally the same functions described herein for the components 102-110.

In some embodiments, the control switch 103 (i.e., a high-side switch) and the synchronous switch 104 (i.e., a low-side switch) are MOSFET (metal-oxide-semiconductor field-effect transistor) devices, such as NMOS power transistor devices as shown, having a source, a drain, and a gate. The control switch 103 and the synchronous switch 104 are electrically connected in series between an input node (at Vin) and a ground, with the drain of the control switch 103 electrically connected to the input node (at Vin) to receive the input voltage Vin, the source of the synchronous switch 104 electrically connected to the ground, and the source of the control switch 103 electrically connected to the drain of the synchronous switch 104.

The drive circuit 107 is electrically connected to the gates of the control switch 103 and the synchronous switch 104. Thus, the drive circuit 107 is any appropriate electronic circuit which, during a normal (or first) mode of operation for the power converter 100, generates high side and low side gate drive signals (at HG and LG, respectively) that turn the control switch 103 and the synchronous switch 104 on and off. In general, the synchronous switch 104 is off when the control switch 103 is on, and the control switch 103 is off when the synchronous switch 104 is on, with an appropriate dead time between on/off switching times when both are off to prevent shoot-through current. Additionally, the synchronous switch 104 is generally not turned on when the current in the output inductor 105 is negative. The alternating on/off operation of the control switch 103 and the synchronous switch 104 generates a switching current and switching voltage at a switch or phase node 111, which is between the source of the control switch 103 and the drain of the synchronous switch 104.

The output inductor 105 has a first node electrically connected to the switch node 111 and a second node electrically connected to an output node (at Vout). The output capacitor 106 has a first node electrically connected to the output node (at Vout) and a second node electrically connected to the ground. Thus, the switching current and switching voltage (generated at the switch node 111) are applied through an output filter (comprising the output inductor 105 and the output capacitor 106) to generate the output voltage Vout (with an output current) to transfer power in a controlled manner from the input node (at Vin) to the output node (at Vout) for powering the load circuit 101.

The drive circuit 107 generates the high side and low side gate drive signals (at HG and LG) in accordance with a pulse width modulation (PWM) signal received from the PWM control and extension circuit 102. The PWM comparator 108 generates an initial PWM signal PWM-init in response to a compensator voltage signal Vcomp (received at a positive input of the PWM comparator 108) and a voltage ramp signal Vramp (received at a negative input of the PWM comparator 108). The voltage ramp signal Vramp is a periodic signal provided or generated by the voltage ramp signal source 110. The compensator voltage signal Vcomp (an error voltage) is generated by the feedback error amplifier 109 and compensated by a frequency compensator or frequency compensation components (not shown).

The feedback error amplifier 109 generates the compensator voltage signal Vcomp based on a feedback voltage signal Vfb (received at a negative input of the feedback error amplifier 109) and a first reference voltage signal Vref1 (received at a positive input of the feedback error amplifier 109). The feedback voltage signal Vfb is (or is based on) the output voltage Vout or is indicative of a voltage level of the output voltage Vout. For example, the feedback voltage signal Vfb may be generated from the output voltage Vout by a voltage divider (not shown). The reference voltage Vref1 is (or is indicative of) a desired voltage level of the output voltage Vout. Therefore, the compensator voltage signal Vcomp is generated by the feedback error amplifier 109 to be indicative of a level of difference between the feedback voltage signal Vfb and the reference voltage signal Vref1 and, thus, a level of difference between the output voltage Vout and the desired voltage level of the output voltage Vout. In other words, a voltage level of the feedback voltage signal Vfb significantly different from the reference voltage signal Vref1 (i.e., a larger difference therebetween) results in a larger voltage level of the compensator voltage signal Vcomp; and a voltage level of the feedback voltage signal Vfb closer to the reference voltage signal Vref1 (i.e., a smaller difference therebetween) results in a smaller voltage level of the compensator voltage signal Vcomp. Additionally, in some embodiments, the compensator voltage signal Vcomp is offset or normalized from zero volts by a plateau or offset voltage amount, and the generation of the voltage ramp signal Vramp takes in to consideration the plateau voltage amount, to ensure that the inputs to the PWM comparator 108 are not zero, since a typical comparator may not operate properly near zero volts.

The PWM comparator 108 asserts the initial PWM signal PWM-init high when the compensator voltage signal Vcomp is greater than or higher than the voltage ramp signal Vramp and de-asserts the initial PWM signal PWM-init low when the compensator voltage signal Vcomp is less than or lower than the voltage ramp signal Vramp. The PWM control and extension circuit 102 generally receives the initial PWM signal PWM-init and generates the PWM signal therefrom with a constant on-time that is triggered with each assertion of the initial PWM signal PWM-init. The off-time is allowed to vary in order to vary the duty cycle of the PWM signal, thereby regulating the output voltage Vout. When the PWM control and extension circuit 102 generally detects that the off-time of the PWM signal is less than a first threshold value that is greater than a minimum off-time limit (i.e., in accordance with the safety buffer), the PWM control and extension circuit 102 generally extends, or increases, the on-time of the PWM signal. Stated another way, when the duty cycle of the PWM signal approaches (but before it reaches) a maximum value, the PWM control and extension circuit 102 extends the on-time of the PWM signal, thereby allowing the duty cycle to increase even more than was possible with the unextended PWM signal. (Alternatively, the PWM control and extension circuit 102 extends the on-time of the PWM signal when the off-time approaches a lower limit, the duty cycle approaches an upper limit, the period approaches a lower limit, the difference between the input voltage Vin and the output voltage Vout (Vin–Vout) approaches a lower limit, or the output voltage Vout approaches an upper limit.) The larger duty cycle capability, thus, enables the power converter 100 to generate the output voltage Vout at a higher maximum voltage level, while still maintaining adequate control stability and sufficient time for making correct decisions during the off-time. Additionally, when the PWM control and extension circuit 102 generally detects that the off-time of the PWM signal is greater than a second threshold value (that is greater than the first threshold value), the PWM control and extension circuit 102 generally decreases the extension of the on-time of the PWM signal. Stated another way, when the duty cycle of the PWM signal is sufficiently below its maximum value, the PWM control and extension circuit 102 decreases the extension of the on-time of the PWM signal, thereby allowing the duty cycle to reflect normal operation of the power converter 100. Furthermore, the operation of the PWM control and extension circuit 102 generally prevents the compensator voltage signal Vcomp from saturating.

Furthermore, in some embodiments, both the increases and the decreases of the extension of the on-time of the PWM signal are made in incremental up/down steps between a normal or minimum on-time and a maximum extended on-time. Additionally, in order to help maintain control and mitigate noise, the incremental up/down steps are made to be relatively small. For example, if it is desired for the maximum extended on-time to be 40% greater than the normal on-time and for the on-time to have 8 possible values between the normal and maximum extended values, then the on-time can be increased or decreased in 7 incremental steps from the normal ($1^{st}$) value to the maximum extended ($8^{th}$) value. If the incremental steps are the same size in this example, then each step increases or decreases the on-time by about 5.7% of its original normal value. Other examples for the value of the maximum extended on-time and the number of increments are also appropriate, depending on the application. Furthermore, each incremental step may be the same size or of different sizes as desired or needed.

In some embodiments, during the high level portion (i.e., the on-time) of its period, the PWM signal generally causes the drive circuit 107 to assert the high side gate drive signal at HG to turn on or activate the control switch 103 and to de-assert the low side gate drive signal at LG to turn off or deactivate the synchronous switch 104. The activated control switch 103 (and deactivated synchronous switch 104) generally causes the level of the switching current and switching voltage (generated at the switch node 111) to increase, which eventually causes the level of the output voltage Vout to increase. On the other hand, during the low level portion (i.e., the off-time) of its period, the PWM signal generally causes the drive circuit 107 to de-assert the high side gate drive signal at HG to turn off or deactivate the control switch 103 and to assert the low side gate drive signal at LG to turn on or activate the synchronous switch 104. The activated synchronous switch 104 (and deactivated control switch 103) eventually causes the level of the switching current and switching voltage (generated at the switch node 111) to decrease, which causes the level of the output voltage Vout to decrease.

Therefore, during the normal mode of operation for the power converter 100, when the voltage level of the output voltage Vout increases to a level that is greater than or higher than the desired voltage level, the difference between the feedback voltage signal Vfb and the reference voltage signal Vref1 decreases. The voltage level of the compensator voltage signal Vcomp then decreases, so the amount of time that the compensator voltage signal Vcomp is above the voltage ramp signal Vramp decreases, and the duty cycle of the PWM signal decreases. The decreased duty cycle of the PWM signal results in the duration of the off-time of the high side gate drive signal at HG being lengthened and the duration of the on-time of the low side gate drive signal at LG being lengthened, so that the control switch 103 is turned on for a smaller amount of the overall time, and the synchronous switch 104 is turned on for a longer amount. The longer off-time of the control switch 103 (and longer on-time of the synchronous switch 104) results in the voltage level of the output voltage Vout being decreased back toward the desired voltage level. Thus, a decreased voltage level of the compensator voltage signal Vcomp, when the output voltage Vout is higher than the desired voltage level, causes the voltage level of the output voltage Vout to decrease back toward the desired voltage level.

Additionally, during the normal mode of operation for the power converter 100, when voltage level of the output voltage Vout decreases to a level that is less than or lower than the desired voltage level, the difference between the feedback voltage signal Vfb and the reference voltage signal Vref1 increases. The voltage level of the compensator voltage signal Vcomp then increases, so the amount of time that the compensator voltage signal Vcomp is above the voltage ramp signal Vramp increases, and the duty cycle of the PWM signal increases. The increased duty cycle of the PWM signal results in the duration of the off-time of the high side gate drive signal at HG being shortened and the duration of the on-time of the low side gate drive signal at LG being shortened, so that the control switch 103 is turned on for a larger amount of the overall time, and the synchronous switch 104 is turned on for a shorter amount. The shorter off-time of the control switch 103 (and shorter on-time of the synchronous switch 104) results in the voltage level of the output voltage Vout being increased back toward the desired voltage level. Thus, an increased voltage level of the compensator voltage signal Vcomp, when the output voltage Vout is lower than the desired voltage level, causes the voltage level of the output voltage Vout to increase back toward the desired voltage level.

Generation of the PWM signal is generally performed using constant on-time techniques, so that the off-time is varied in order to generate the PWM signal with the appropriate duty cycle for the power and voltage level required by the load circuit 101 at any given time. When the on-time is extended by the PWM control and extension circuit 102, the PWM signal is still generated using constant on-time techniques, but with the extended on-time. In this manner, extending the on-time also allows for the off-time to be extended by normal constant on-time operating techniques, so that the duty cycle will remain approximately the same immediately after extending the on-time as it was immediately before. The voltage level of the output voltage Vout, thus, also remains approximately the same immediately after extending the on-time as it was immediately before. However, the consequent extension of the off-time allows for the off-time to be reduced again, so that the duty cycle and the output voltage Vout can be increased to higher levels than were possible before extending the on-time. The extension of the on-time, therefore, allows for greater flexibility in generation of the output voltage Vout, as may be needed during operation of the load circuit 101.

Figure 2:
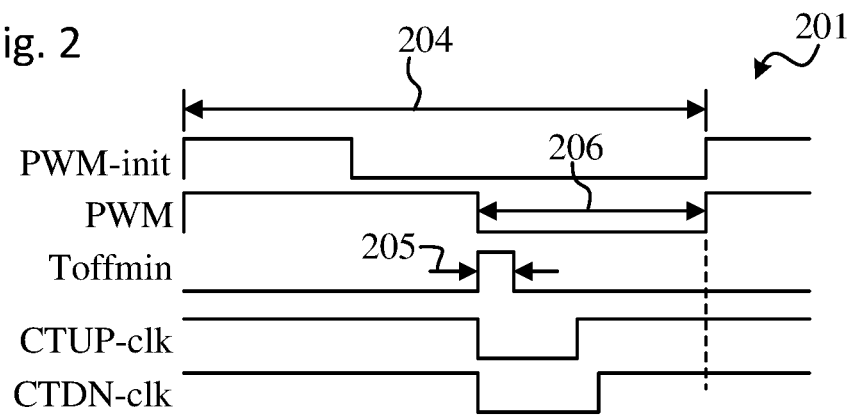
FIG. 2 shows simplified timing diagrams illustrating operation of the PWM signal extension capabilities of the power converter shown in FIG. 1, in accordance with some embodiments.
Figure 2:
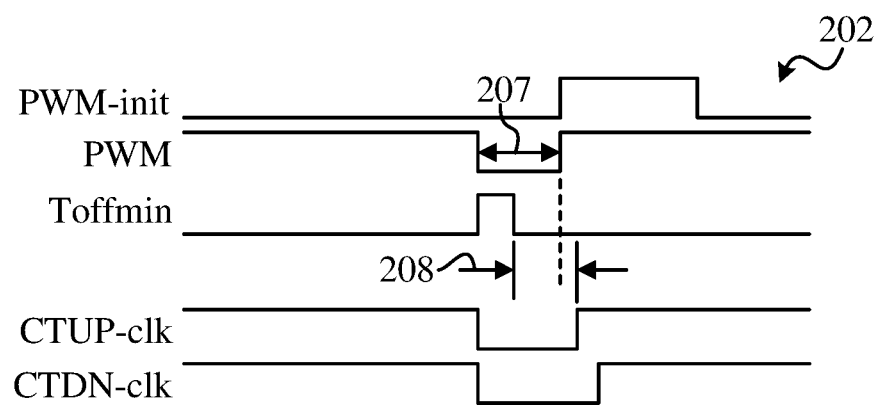
Figure 2:
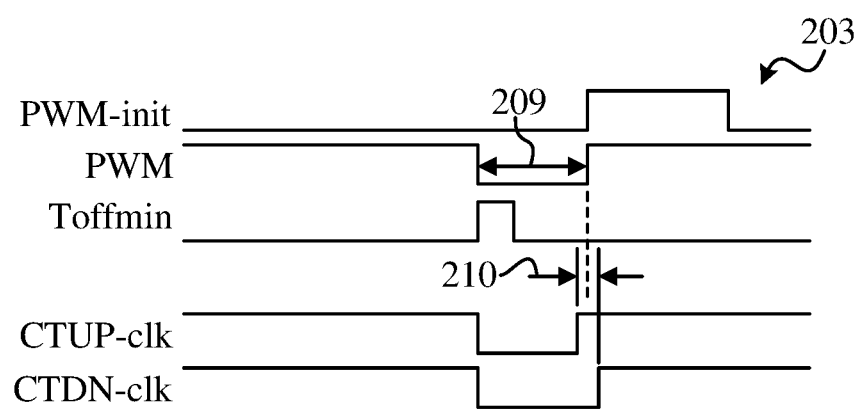

An example operation of the PWM control and extension circuit 102 is illustrated by simplified example timing diagrams shown in FIG. 2. Timing diagrams 201 generally illustrate operation of the PWM control and extension circuit 102 during normal operation when there is no need to increase but may decrease the extension of the on-time. Timing diagrams 202 generally illustrate operation of the PWM control and extension circuit 102 when there is a need to increase the extension of the on-time. Timing diagrams 203 generally illustrate operation of the PWM control and extension circuit 102 when there is no need to increase or decrease the extension of the on-time. For purposes of description and illustration, the timing diagrams may represent idealized versions of the named signals (or of alternative signals that are based on the named signals) within the PWM control and extension circuit 102. Additionally, it is understood that the depiction and description of rising and falling edges, high and low signals, and logic 1 and logic 0 values in the timing diagrams may be reversed in some embodiments for some signals.

The timing diagrams 201 include the initial PWM signal PWM-init, the PWM signal, a minimum off-time signal Toffmin, a count-up clock signal CTUP-clk, and a count-down clock signal CTDN-clk. The period of the initial PWM signal PWM-init and the PWM signal is shown by dimension arrow 204. The rising edge of the PWM signal is triggered by the rising edge of the initial PWM signal PWM-init at the beginning or end of the illustrated period. The initial PWM signal PWM-init resets at its falling edge in accordance with the operation of the PWM comparator 108 as described above. The PWM signal resets at its falling edge as controlled by the constant on-time provided by the PWM control and extension circuit 102, as described below, and triggers the rising edge of the minimum off-time signal Toffmin. Additionally, the duration of the minimum off-time signal Toffmin, as shown by dimension arrows 205, is indicative of the minimum allowable off-time for the PWM signal. The count-up clock signal CTUP-clk and the count-down clock signal CTDN-clk are used to detect when to increase or decrease or hold steady the extension of the on-time of the PWM signal.

In the timing diagrams 201, the off-time of the PWM signal, as shown by dimension arrow 206, is larger than the minimum off-time signal Toffmin such that the end of the off-time occurs after the rising edges of both the count-up clock signal CTUP-clk and the count-down clock signal CTDN-clk. Alternatively, a signal indicating the start of the next on-time occurs after the end of both the count-up clock signal CTUP-clk and the count-down clock signal CTDN-clk. In this situation, the on-time of the PWM signal does not need to be extended, so the PWM control and extension circuit 102 does not extend the on-time. On the other hand, if the on-time is already currently extended in this situation, then the on-time extension can be decreased, so the PWM control and extension circuit 102 decreases the extension of the on-time by one incremental step. The on-time is not decreased less than the normal or minimum on-time. In some embodiments, the PWM control and extension circuit 102 decreases the on-time extension by one incremental step each time or each period in which this situation is encountered. Alternatively, the PWM control and extension circuit 102 waits a predetermined amount of time or predetermined number of consecutive periods in which this situation is repeated before decreasing the on-time extension, thereby ensuring that the PWM signal is stable, so that the PWM control and extension circuit 102 does not decrease the on-time extension when the need for doing so may be uncertain.

The timing diagrams 202 again include the initial PWM signal PWM-init, the PWM signal, the minimum off-time signal Toffmin, the count-up clock signal CTUP-clk, and the count-down clock signal CTDN-clk. In the timing diagrams 202, the off-time of the PWM signal, as shown by dimension arrow 207, is less than the duration of the count-up clock signal CTUP-clk such that the end of the off-time occurs after the end (i.e., the falling edge) of the minimum off-time signal Toffmin but before the end (i.e., the rising edge) of the count-up clock signal CTUP-clk. Alternatively, the signal indicating the start of the next on-time occurs before the end of the count-up clock signal CTUP-clk. The rising edge of the count-up clock signal CTUP-clk, thus, represents the first threshold value that is greater than the minimum off-time limit (i.e., in accordance with the safety buffer), as indicated by the dimension arrows 208. In this situation, the PWM control and extension circuit 102 extends the on-time of the PWM signal by one incremental step. The on-time is not increased more than the maximum extended on-time. In some embodiments, the PWM control and extension circuit 102 increases the on-time extension by one incremental step each time or each period in which this situation is encountered. Alternatively, the PWM control and extension circuit 102 waits a predetermined amount of time or predetermined number of consecutive periods in which this situation is repeated before increasing the on-time extension, thereby ensuring that the PWM signal is stable, so that the PWM control and extension circuit 102 does not increase the on-time extension when the need for doing so may be uncertain. (This predetermined amount of time or predetermined number of consecutive periods may be the same as that mentioned above, as shown in an example below, or may be greater or less than that mentioned above.) Additionally, since the first threshold value represented by the rising edge of the count-up clock signal CTUP-clk is greater than the minimum off-time limit represented by the end of the minimum off-time signal Toffmin, the PWM control and extension circuit 102 begins to extend the on-time of the PWM signal before the off-time thereof can potentially drop below the minimum off-time, thereby avoiding any potential problems associated with inadequate control stability or insufficient time for making correct decisions during the off-time, among other potential problems. In some embodiments, the difference between the falling edge of the minimum off-time signal Toffmin and the rising edge of the count-up clock signal CTUP-clk (i.e., the length of the safety buffer), as indicated by the dimension arrows 208, is about 5 ns to about 20 ns, which can be programmable.

The timing diagrams 203 again include the initial PWM signal PWM-init, the PWM signal, the minimum off-time signal Toffmin, the count-up clock signal CTUP-clk, and the count-down clock signal CTDN-clk. In the timing diagrams 203, the off-time of the PWM signal, as shown by dimension arrow 209, is greater than the duration of the count-up clock signal CTUP-clk but less than the duration of the count-down clock signal CTDN-clk such that the end of the off-time occurs after the end (i.e., the rising edge) of the count-up clock signal CTUP-clk but before the end (i.e., the rising edge) of the count-down clock signal CTDN-clk. Alternatively, the signal indicating the start of the next on-time occurs after the end of the count-up clock signal CTUP-clk and before the end of the count-down clock signal CTDN-clk. The rising edge of the count-down clock signal CTDN-clk, thus, represents the second threshold value that is greater than the first threshold value, as indicated by the dimension arrows 210. In this situation, the on-time of the PWM signal does not need to be increased or decreased, so the PWM control and extension circuit 102 does not change the on-time extension of the PWM signal. The use of the second threshold value in addition to the first threshold value provides for some hysteresis between the points at which the PWM control and extension circuit 102 will increase or decrease the on-time extension. In some embodiments, the difference between the rising edge of the count-up clock signal CTUP-clk and the rising edge of the count-down clock signal CTDN-clk, as indicated by the dimension arrows 210, is about 5 ns.

Figure 3:
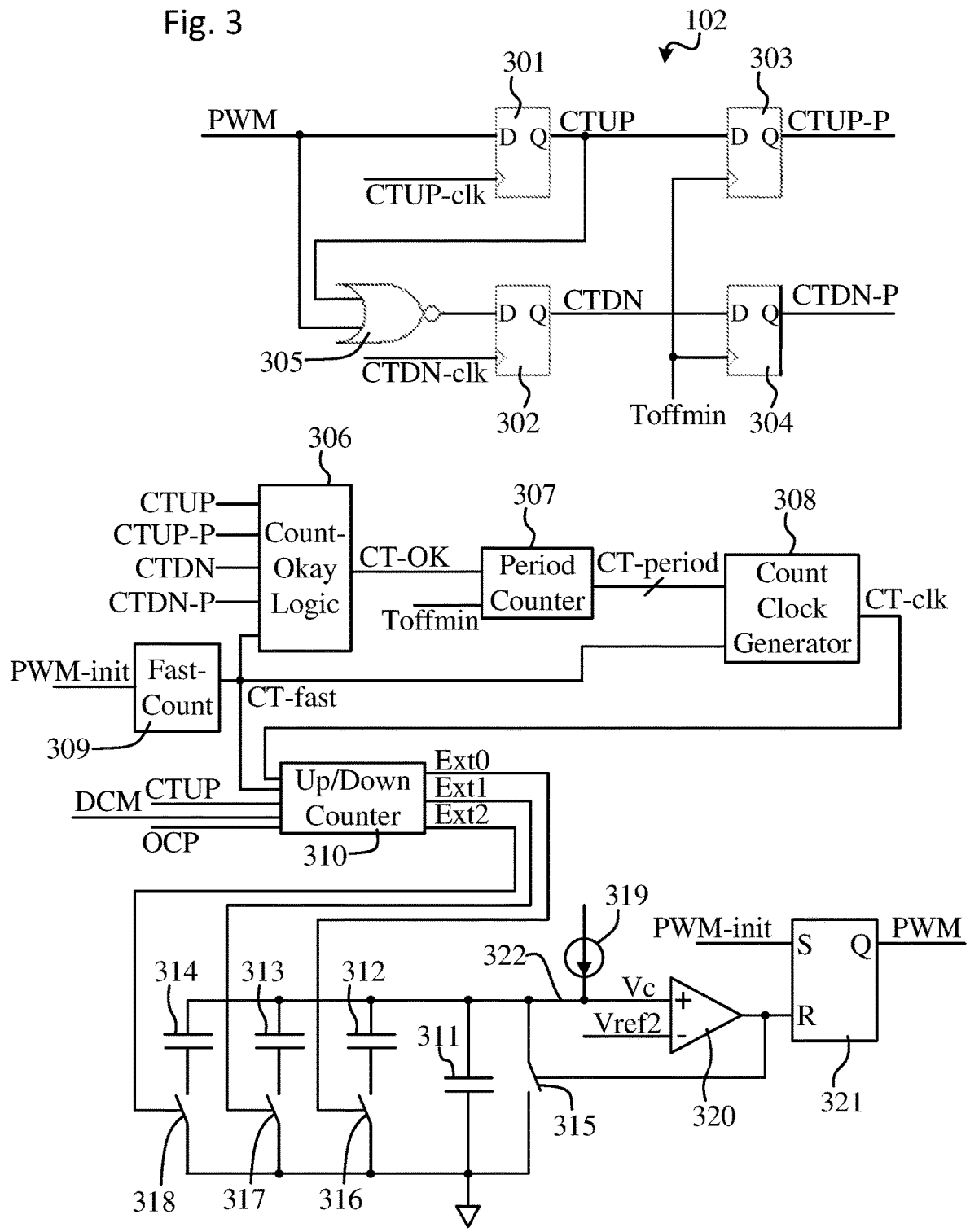
FIG. 3 is a simplified schematic diagram of a PWM control and extension circuit for use in the power converter shown in FIG. 1, in accordance with some embodiments.

A simplified example circuit for the PWM control and extension circuit 102 is shown in FIG. 3. In this example, the PWM control and extension circuit 102 generally includes D flipflops 301-304, a logic gate 305, count-okay logic 306, a period counter 307, a count clock generator 308, fast-count logic 309, an up/down counter 310, capacitors 311-314, switches 315-318, a current source 319, a comparator 320, and an SR flipflop 321, among other components not shown for simplicity. Alternatively, in some embodiments, different components or combinations of components can be used to perform generally the same functions described herein for the components 301-321.

The D flipflops 301 and 302 and the logic gate 305 generate a count-up signal CTUP and a count-down signal CTDN in response to the PWM signal, the count-up clock signal CTUP-clk, and the count-down clock signal CTDN-clk. The D flipflop 301 receives the PWM signal at a D input, receives the count-up clock signal CTUP-clk at a clock input, and outputs the count-up signal CTUP at a Q output. In this configuration, the D flipflop 301 asserts the count-up signal CTUP when the count-up clock signal CTUP-clk goes high with the PWM signal already high (and otherwise de-asserts the count-up signal CTUP), thereby indicating that the on-time of the PWM signal may need to be extended if possible, as would occur in the example timing diagrams 202. The D flipflop 301, therefore, detects when the off-time of the PWM signal is less than the first threshold value that is greater than a minimum off-time limit. (The first threshold value is indicated by the count-up clock signal CTUP-clk going high.) The logic gate 305 (e.g., a NOR gate) receives the PWM signal and the count-up signal CTUP at inputs thereof and outputs a high signal when both inputs are low. The D flipflop 302 receives the output of the logic gate 305 at a D input, receives the count-down clock signal CTDN-clk at a clock input, and outputs the count-down signal CTDN at a Q output. In this configuration with the logic gate 305, the D flipflop 302 asserts the count-down signal CTDN when the count-down clock signal CTDN-clk goes high with the output of the logic gate 305 already high (and otherwise de-asserts the count-down signal CTDN), thereby indicating that the extension of the on-time of the PWM signal may need to be decreased if possible, as would occur in the example timing diagrams 201. The D flipflop 302, therefore, detects when the off-time is greater than the second threshold value that is greater than the first threshold value. (The second threshold value is indicated by the count-down clock signal CTDN-clk going high.)

Additionally, the D flipflop 303 receives the count-up signal CTUP at a D input, receives the minimum off-time signal Toffmin at a clock input, and outputs or asserts a previous count-up signal CTUP-P at a Q output. Also, the D flipflop 304 receives the count-down signal CTDN at a D input, receives the minimum off-time signal Toffmin at a clock input, and outputs or asserts a previous count-down signal CTDN-P at a Q output. Therefore, since the minimum off-time signal Toffmin occurs before the rising edges of the count-up clock signal CTUP-clk and the count-down clock signal CTDN-clk, the D flipflops 303 and 304 latch the previous-period values (i.e., asserted or de-asserted) of the count-up signal CTUP and the count-down signal CTDN as the previous count-up signal CTUP-P and the previous count-down signal CTDN-P, respectively, before the count-up signal CTUP and the count-down signal CTDN can be changed in the current period. Therefore, the count-up signal CTUP is a current count-up signal for a current period of the PWM signal, the previous count-up signal CTUP-P is a previous count-up signal for an immediately previous period of the PWM signal, the count-down signal CTDN is a current count-down signal for the current period of the PWM signal, and the previous count-down signal CTDN-P is a previous count-down signal for the immediately previous period of the PWM signal.

The count-okay logic 306 receives the count-up signal CTUP, the previous count-up signal CTUP-P, the count-down signal CTDN, and the previous count-down signal CTDN-P. (In some embodiments, the count-okay logic 306 also optionally receives a fast-count signal CT-fast as described below.) In response to the count-up signal CTUP and the previous count-up signal CTUP-P both being asserted, or in response to the count-down signal CTDN and the previous count-down signal CTDN-P both being asserted, the count-okay logic 306 outputs or asserts a count-okay signal CT-OK at its output. On the other hand, when the count-up signal CTUP and the count-down signal CTDN have changed since the previous period (as indicated by the count-up signal CTUP being different from the previous count-up signal CTUP-P or the count-down signal CTDN being different from the previous count-down signal CTDN-P), then the count-okay logic 306 de-asserts the count-okay signal CT-OK at its output. Additionally, when both the count-up signal CTUP and the count-down signal CTDN are de-asserted (indicating the situation shown by timing diagrams 203), then the count-okay logic 306 de-asserts the count-okay signal CT-OK at its output.

The period counter 307 receives the count-okay signal CT-OK and the minimum off-time signal Toffmin and generates therewith a period-count CT-period as its output. As long as the count-okay signal CT-OK is asserted (i.e., as long as the count-up signal CTUP and the count-down signal CTDN do not change from a previous period), the period counter 307 increments its output count with each period indicated by assertion of the minimum off-time signal Toffmin. In this manner, the period counter 307 counts a number of consecutive periods in which the count-up signal CTUP and the count-down signal CTDN do not change from a previous period up to a maximum count value. The period counter 307 outputs the count of the periods as the period-count CT-period. The period counter 307 produces any appropriate number of count bits for the period-count CT-period in order to count any appropriate number of consecutive periods, depending on the requirements of the particular application. Thus, the maximum count value represents the predetermined number of consecutive periods. Additionally, when the count-okay signal CT-OK is de-asserted (indicating that the count-up signal CTUP and/or the count-down signal CTDN has changed from a previous period or that both the count-up signal CTUP and the count-down signal CTDN are de-asserted), the period counter 307 resets its count to the beginning, e.g., zero. The period counter 307 also resets its count to the beginning in a period subsequent to the period in which the period-count CT-period reaches its maximum count value (i.e., the predetermined number of consecutive periods without a change in the count-up signal CTUP and/or the count-down signal CTDN).

The count clock generator 308 receives the period-count CT-period and generates a clock count signal CT-clk. (In some embodiments, the count clock generator 308 also optionally receives the fast-count signal CT-fast as described below.) In response to the period-count CT-period from the period counter 307 reaching its maximum count value (of a predetermined number of consecutive periods), the count clock generator 308 asserts the clock count signal CT-clk, e.g., for one half of a period. In other words, the count clock generator 308 detects when the output of the period counter 307 reaches its maximum count value and outputs or asserts the clock count signal CT-clk in response thereto. Otherwise, the count clock generator 308 maintains the clock count signal CT-clk as de-asserted. In this manner, the count clock generator 308 asserts the clock count signal CT-clk whenever the count-up signal CTUP and/or the count-down signal CTDN maintain their values throughout the predetermined number of consecutive periods, i.e., the D flipflop 301 or 302 counts up or counts down, respectively, for the predetermined number of consecutive periods. In some embodiments, the predetermined number of consecutive periods is 8 or 9 periods. In some embodiments, the actions of the components 301-308 and the clock count signal CT-clk result in the increase in the on-time extension of the PWM signal occurring only when the off-time is detected to be less than the first threshold value (as indicated by the count-up signal CTUP) for at least 2-9 consecutive periods of the PWM signal. Similarly, the actions of the components 301-308 and the clock count signal CT-clk result in the decrease in the on-time extension of the PWM signal occurring only when the off-time is detected to be greater than the second threshold value (as indicated by the count-down signal CTDN) for at least 2-9 consecutive periods of the PWM signal.

The up/down counter 310 receives the clock count signal CT-clk and the count-up signal CTUP and generates a count value in on-time extension count bits Ext0, Ext1 and Ext 2 as its output. The count value of the on-time extension count bits Ext0, Ext1 and Ext 2 is used, as described below, to set the extension of the on-time of the PWM signal. In the illustrated example, the up/down counter 310 is a three-bit counter, which enables eight on-time extension states, e.g., the non-extended, normal or minimum on-time and seven incremental extended on-times. However, any appropriate number of bits may be produced by the up/down counter 310 for any appropriate number of extension increments or states. Each assertion of the clock count signal CT-clk when the count-up signal CTUP is also asserted is an indication that the count-up signal CTUP has been held asserted for the predetermined number of consecutive periods, i.e., the output of the period counter 307 has reached its maximum count value. Therefore, with each assertion of the clock count signal CT-clk when the count-up signal CTUP is also asserted and the up/down counter 310 has not reached its maximum value, i.e., in response to the output of the period counter 307 reaching its maximum count value, the up/down counter 310 increments or increases the count value of the on-time extension count bits Ext0, Ext1 and Ext 2. On the other hand, each assertion of the clock count signal CT-clk when the count-up signal CTUP is de-asserted is an indication that the count-down signal CTDN has been held asserted for the predetermined number of consecutive periods. Therefore, with each assertion of the clock count signal CT-clk when the count-up signal CTUP is de-asserted and the up/down counter 310 has not reached its minimum value, the up/down counter 310 decrements or decreases the count value of the on-time extension count bits Ext0, Ext1 and Ext 2. The de-assertion of the count-up signal CTUP can be used in this manner, because the example implementation ensures that the count-up signal CTUP is de-asserted when the count-down signal CTDN is asserted; however, in alternative embodiments, the up/down counter 310 can also receive the count-down signal CTDN and, thereby, decrement or decrease the count value of the on-time extension count bits Ext0, Ext1 and Ext 2 when the count-down signal CTDN is asserted with each assertion of the clock count signal CT-clk. In this manner, given the above-described operation of the components 301-308, whenever the situation shown by timing diagrams 202 occurs (i.e., the components 301-308 of the PWM control and extension circuit 102 detect that the off-time of the PWM signal is less than the first threshold value that is greater than the minimum off-time limit) for the predetermined number of consecutive periods, the up/down counter 310 will increase or increment the count value of the on-time extension count bits Ext0, Ext1 and Ext 2 up to the maximum count value. Likewise, whenever the situation shown by timing diagrams 201 occurs (i.e., the components 301-308 of the PWM control and extension circuit 102 detect that the off-time of the PWM signal is greater than a second threshold value that is greater than the first threshold value) for the predetermined number of consecutive periods, the up/down counter 310 will decrease or decrement the count value of the on-time extension count bits Ext0, Ext1 and Ext 2 down to the minimum count value, e.g., zero. Additionally, whenever the situation shown by timing diagrams 203 occurs (i.e., the components 301-308 of the PWM control and extension circuit 102 detect that the off-time of the PWM signal is greater than the first threshold value and less than the second threshold value), the up/down counter 310 does not change the count value of the on-time extension count bits Ext0, Ext1 and Ext 2. In some embodiments, therefore, the components 301-308 form an off-time detection circuit that detects that the off-time of the PWM signal is 1) less than the first threshold value, 2) greater than the first threshold value and less than the second threshold value, or 3) greater than the second threshold value.

In some embodiments, up/down counter 310 also optionally receives the fast-count signal CT-fast, a discontinuous conduction mode (DCM) signal, and an over current protection (OCP) signal.

The DCM signal is generated in a conventional manner and indicates that the power converter 100 should enter DCM operation. In some embodiments, the power converter 100 will not enter DCM operation if the on-time is already extended, thereby mitigating any risk of switching back and forth between continuous conduction mode (CCM) and DCM operation (i.e., CCM/DCM chatter). However, in some embodiments, the DCM signal causes the up/down counter 310 to set all of the on-time extension count bits Ext0, Ext1 and Ext 2 to a high value, so that the power converter 100 operates with the maximum extended on-time during DCM operation or as long as the DCM signal is asserted. Upon exiting from DCM operation (i.e., de-assertion of the DCM signal), the on-time extension (i.e., the count value of bits Ext0, Ext1 and Ext 2) will step down (if appropriate) according to the operation of the components 301-308 as described above. The stepping down of the on-time extension, instead of immediate full reduction thereof, upon exiting from DCM to CCM ensures a smooth transition from DCM to CCM.

The OCP signal is triggered in a conventional manner and indicates that the power converter 100 has encountered a potential over-current condition. In some embodiments, the OCP signal causes the up/down counter 310 to maintain its present state, i.e., the count value of the on-time extension count bits Ext0, Ext1 and Ext 2 is not changed as long as the OCP signal is asserted. Additionally, in some embodiments, the OCP signal is also provided to the period counter 307 for the period counter 307 to reset its period-count CT-period.

The fast-count logic 309 represents any appropriate logic circuitry that detects a situation in which it is desirable to rapidly increase the on-time extension. The fast-count logic 309 asserts the fast-count signal CT-fast when such a situation is detected and otherwise de-asserts the fast-count signal CT-fast. For example, in some embodiments, the fast-count logic 309 receives the initial PWM signal PWM-init, the count-up signal CTUP, and the minimum off-time signal Toffmin and generates the fast-count signal CT-fast when the initial PWM signal PWM-init and the count-up signal CTUP are asserted when the minimum off-time signal Toffmin goes low or is de-asserted. In this manner, the fast-count logic 309 asserts the fast-count signal CT-fast when the initial PWM signal PWM-init remains asserted or logic high for an entire period when the on-time has already been extended at least one increment by the operation described above for components 301-308 and 310. Each of the following example uses of the fast-count signal CT-fast may be considered optional. In the example illustrated in FIG. 3, the fast-count signal CT-fast is received by the count-okay logic 306, the count clock generator 308, and the up/down counter 310. In alternative embodiments, one or more of these components 306, 308 and 310, rather than all of them, receives the fast-count signal CT-fast. For each of these components 306, 308 and 310 that receives the fast-count signal CT-fast, assertion of the fast-count signal CT-fast generally overrides the above-described operation thereof in order to cause a more rapid increase in the on-time extension. The count-okay logic 306, for example, asserts the count-okay signal CT-OK when the fast-count signal CT-fast is asserted, regardless of the state of the count-up signal CTUP, the previous count-up signal CTUP-P, the count-down signal CTDN, and the previous count-down signal CTDN-P, thereby ensuring that the period counter 307 counts every period, instead of just those for which the count-up signal CTUP or the count-down signal CTDN did not change. The count clock generator 308 asserts the clock count signal CT-clk when the fast-count signal CT-fast is asserted, regardless of the count of the period-count CT-period, thereby ensuring that the up/down counter 310 increments its count value every period or more often than the predetermined number of consecutive periods mentioned above. Additionally, the up/down counter 310 increments the count value of the on-time extension count bits Ext0, Ext1 and Ext 2 by more than one incremental step or more than one bit when the fast-count signal CT-fast is asserted, regardless of when the clock count signal CT-clk is asserted. Any one or more of the above example uses of the fast-count logic 309 and the fast-count signal CT-fast may be included in the power converter 100 or the PWM control and extension circuit 102 to ensure that the increase in the on-time extension occurs more rapidly when needed. Additionally, in some embodiments, the fast-count signal or another similar signal can be used to count back down in a fast manner, while also ensuring against bouncing back and forth between a fast up count and a fast down count.

Some of the above description of the example circuit shown in FIG. 3 ensures that the increase or decrease in the on-time extension of the PWM signal does not occur too quickly in order to avoid rapid back and forth increasing and decreasing of the on-time extension. In some embodiments, however, it may be preferable always to ensure rapid changing of the on-time extension. In this case, the operations of the D flipflops 303 and 304, the count-okay logic 306, the period counter 307, the count clock generator 308, and the fast-count logic 309 may be unnecessary, so these components may not be included. Instead, the count-up signal CTUP and the count-down signal CTDN could be provided directly to the up/down counter 310, so that the up/down counter 310 can increment and decrement, respectively, the count value of the on-time extension count bits Ext0, Ext1 and Ext 2 with each assertion of these signals.

The capacitors 311-314, the switches 315-318, the current source 319, the comparator 320, and the SR flipflop 321 control the generation of the PWM signal in accordance with, or based on, the initial PWM signal PWM-init and the on-time extension count bits Ext0, Ext1 and Ext 2. The capacitors 311-314 and the first switch 315 are electrically connected in parallel between the current source 319 and ground (or a reference voltage). Additionally, each of the switches 316-318 is electrically connected in series between a corresponding one of the capacitors 312-314 and the ground. Control inputs of the second, third and fourth switches 316, 317 and 318 are electrically connected to the outputs for the on-time extension count bits Ext0, Ext1 and Ext 2, respectively, so that the on-time extension count bits Ext0, Ext1 and Ext 2 are provided to the control inputs of the switches 316, 317 and 318, respectively. Thereby, when any of the on-time extension count bits Ext0, Ext1 and Ext 2 is high or logic 1, then its respective switch 316-318 is closed and the corresponding capacitor 312-314 is connected into the circuit between the current source 319 and ground; and when any of the on-time extension count bits Ext0, Ext1 and Ext 2 is low or logic 0, then its respective switch 316-318 is open and the corresponding capacitor 312-314 is disconnected from the circuit. Alternatively, in some embodiments, the on-time extension count bits Ext0, Ext1 and Ext 2 can be provided to the current source 319 to change the level of the current output therefrom, instead of or in addition to changing the capacitance in the circuit.

A node 322 between the current source 319 and each of the components 311-315 is electrically connected to a positive input of the comparator 320. A second reference voltage Vref2 is electrically connected to a negative input of the comparator 320. When a voltage level of the node 322 (charge voltage Vc) rises above the voltage level of the second reference voltage Vref2, the comparator 320 asserts its output, e.g., goes high; and when the charge voltage Vc falls below the voltage level of the second reference voltage Vref2, the comparator 320 de-asserts its output, e.g., goes low. In some embodiments, the current output by the current source 319 and/or the voltage level of the second reference voltage Vref2 can be based on the input voltage Vin or the output voltage Vout or other factors in order to achieve circuit characteristics similar to a constant frequency operation over different operating conditions. The SR flipflop 321 receives the output of the comparator 320 at an R input, receives the initial PWM signal PWM-init at an S input, and generates the PWM signal at a Q output. Thus, the SR flipflop 321 asserts the PWM signal at the Q output when the initial PWM signal PWM-init is asserted at the S input and de-asserts the PWM signal at the Q output when the output of the comparator 320 is asserted at the R input.

A control input of the first switch 315 is electrically connected to an output of the comparator 320. Thus, when the first switch 315 receives the de-asserted output of the comparator 320, the first switch 315 is open, thereby allowing the current source 319 to charge up the first capacitor 311 and any of the capacitors 312-314 that have been connected into the circuit by the corresponding switch 316-318 according to the respective on-time extension count bit Ext0, Ext1 and Ext 2. On the other hand, when the first switch 315 receives the asserted output of the comparator 320, the first switch 315 is closed, thereby discharging the capacitors 311-314.

Under normal or non-extended operation of the power converter 100, i.e., when the count value of the on-time extension count bits Ext0, Ext1 and Ext 2 is 000b, the switches 316-318 are open, so that none of the capacitors 312-314 is connected into the circuit. In this case, when the first switch 315 is open, only the first capacitor 311 is charged up when the switch 315 is open. When the count value of the on-time extension count bits Ext0, Ext1 and Ext 2 is 001b, the capacitor 312 is added to the circuit in parallel with the capacitor 311, so both of these capacitors 311 and 312 are charged up when the switch 315 is open. When the count value of the on-time extension count bits Ext0, Ext1 and Ext 2 is 010b, the capacitor 313 is added to the circuit in parallel with the capacitor 311, so both of these capacitors 311 and 313 are charged up when the switch 315 is open. When the count value of the on-time extension count bits Ext0, Ext1 and Ext 2 is 011b, the capacitors 312 and 313 are added to the circuit in parallel with the capacitor 311, so the capacitors 311-313 are charged up when the switch 315 is open. Similarly, with each count value of the on-time extension count bits Ext0, Ext1 and Ext 2, a different combination of the capacitors 311-314 is included in the circuit. Each different combination of the capacitors 311-314 results in the charge voltage Vc being produced at a different rate, so that the charge voltage Vc reaches the second reference voltage Vref2 at a different time.

The capacitance of the capacitor 311 results in the charge voltage Vc reaching the voltage level of the second reference voltage Vref2 at the minimum on-time, so that the output of the comparator 320 resets the SR flipflop 321, and thereby resets the PWM signal, at the minimum on-time. Additionally, the capacitance of the first additional capacitor 312 is such that it adds one incremental step to the extended on-time, the capacitance of the second additional capacitor 313 is such that it adds two incremental steps to the extended on-time, and the capacitance of the third additional capacitor 314 is such that it adds four incremental steps to the extended on-time. Therefore, the parallel combined capacitance of the capacitors 311 and 312 results in the charge voltage Vc reaching the voltage level of the second reference voltage Vref2 at the first incremental step greater than the minimum on-time, so that the PWM signal is reset at the first extended on-time. Additionally, the parallel combined capacitance of the capacitors 311 and 313 results in the charge voltage Vc reaching the voltage level of the second reference voltage Vref2 at the second incremental step greater than the minimum on-time, so that the PWM signal is reset at the seconded extended on-time. Furthermore, the parallel combined capacitance of the capacitors 311-313 results in the charge voltage Vc reaching the voltage level of the second reference voltage Vref2 at the third incremental step greater than the minimum on-time, so that the PWM signal is reset at the third extended on-time. The stepping through of the different combinations of the capacitors 311-314 continues with each incremental step until all three additional capacitors 312-314 are combined in parallel with the first capacitor 311 to result in the PWM signal being reset at the maximum extended on-time. A reverse of this process provides for decrementing each step back down toward the minimum on-time. Thus, the components 310-321 serve as an on-time adjusting circuit that 1) extends the on-time in response to the components 301-308 detecting that the off-time is less than the first threshold value (for the predetermined number of consecutive periods), and 2) decreases the extension of the on-time in response to the components 301-308 detecting that the off-time is greater than the second threshold value (for the predetermined number of consecutive periods).

The above-described circuitry and process have been tested in simulation and laboratory embodiments using switching frequencies of 0.667 MHz, 1 MHz, 1.67 MHz, and 2 MHz, a first threshold value greater than the minimum off-time limit by 5 ns, 10 ns and 20 ns, a second threshold value greater than the first threshold value by 5 ns, and an input voltage Vin of about 24 Volts. The test simulation demonstrated that the maximum duty cycle could be reliably increased by about 1-2.7 percentage points resulting in an increase of the output voltage Vout of about 0.23-0.66 Volts without undue negative consequences for the control or ripple of the output voltage Vout.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
   switching a power transistor on and off with an on-time that is held constant and an off-time that is varied;
   detecting that the off-time is less than a threshold value that is greater than a minimum off-time limit;
   extending the on-time in response to the detecting that the off-time is less than the threshold value; and
   switching the power transistor on and off with an extended on-time that is held constant and the off-time that varies;
   wherein the on-time is extended before the off-time reaches the minimum off-time limit.

2. The method of claim 1, wherein the threshold value is a first threshold value, the method further comprising:
   detecting that the off-time is greater than a second threshold value that is greater than the first threshold value; and
   decreasing the extended on-time in response to the detecting that the off-time is greater than the second threshold value.

3. The method of claim 1, further comprising:
   repeatedly detecting that the off-time is less than the threshold value; and
   repeating the extending of the on-time, up to a maximum extended on-time, each time the off-time is detected to be less than the threshold value.

4. The method of claim 1, further comprising:
   detecting that the off-time is less than the threshold value by detecting that an on-time start signal indicating a start of the on-time occurs within a predetermined time limit after the minimum off-time limit.

5. The method of claim 4, further comprising:
   maintaining the extended on-time when the on-time start signal occurs within a second predetermined time limit after the predetermined time limit; and
   decreasing the extended on-time when the on-time start signal occurs after the second predetermined time limit.

6. The method of claim 1, further comprising:
   detecting that the off-time is less than the threshold value for a predetermined number of consecutive periods of a switching signal that switches the power transistor on and off;
   and wherein:
   the extending of the on-time occurs in response to the detecting that the off-time is less than the threshold value for the predetermined number of consecutive periods of the switching signal.

7. The method of claim 6, wherein the threshold value is a first threshold value, the method further comprising:
   detecting that the off-time is greater than a second threshold value for the predetermined number of consecutive periods of the switching signal, the second threshold value being greater than the first threshold value; and
   decreasing the extended on-time in response to the detecting that the off-time is greater than the second threshold value for the predetermined number of consecutive periods of the switching signal.

8. The method of claim 1, further comprising:
for each period of a predetermined number of consecutive periods of a switching signal that switches the power transistor on and off:
asserting a previous count-up signal for a previous period in response to detecting that the off-time was less than the threshold value during the previous period;
asserting a current count-up signal in response to detecting that the off-time is less than the threshold value;
asserting a count-okay signal in response to both the previous count-up signal and the current count-up signal being asserted; and
incrementing an output of a period counter in response to the count-okay signal being asserted;
detecting that the output of the period counter has reached a maximum count value and that the current count-up signal is asserted;
incrementing an output of an up/down counter in response to detecting that the output of the period counter has reached the maximum count value and that the current count-up signal is asserted; and
extending the on-time based on the output of the up/down counter.

9. The method of claim 8, wherein the threshold value is a first threshold value, the method further comprising:
for each period of the predetermined number of consecutive periods of the switching signal:
asserting a previous count-down signal for the previous period in response to detecting that the off-time was greater than a second threshold value during the previous period, the second threshold value being greater than the first threshold value;
asserting a current count-down signal in response to detecting that the off-time is greater than the second threshold value;
asserting the count-okay signal in response to both the previous count-down signal and the current count-down signal being asserted; and
incrementing the output of the period counter in response to the count-okay signal being asserted;
detecting that the output of the period counter has reached the maximum count value and that the current count-up signal is not asserted;
decrementing the output of the up/down counter in response to detecting that the output of the period counter has reached the maximum count value and that the current count-up signal is not asserted; and
decreasing the extended on-time based on the output of the up/down counter.

10. The method of claim 9, further comprising:
for each period of the predetermined number of consecutive periods of the switching signal:
de-asserting the count-okay signal in response to 1) the current count-up signal being different from the previous count-up signal, 2) the current count-down signal being different from the previous count-down signal, or 3) both the current count-up signal and the current count-down signal being de-asserted; and
resetting the output of the period counter in response to the count-okay signal being de-asserted.

11. An electronic circuit comprising:
a power transistor that is turned on for an on-time and off for an off-time by a pulse width modulated (PWM) signal;
a PWM signal generator that generates the PWM signal by holding the on-time constant and varying the off-time;
an off-time detection circuit that detects that the off-time is less than a threshold value that is greater than a minimum off-time limit;
an on-time adjusting circuit that extends the on-time in response to detecting that the off-time is less than the threshold value;
wherein the on-time is extended before the off-time reaches the minimum off-time limit.

12. The electronic circuit of claim 11, wherein:
the threshold value is a first threshold value;
the off-time detection circuit further detects that the off-time is greater than a second threshold value that is greater than the first threshold value; and
the on-time adjusting circuit decreases the extension of the on-time in response to detecting that the off-time is greater than the second threshold value.

13. The electronic circuit of claim 11, wherein:
the off-time detection circuit repeatedly detects that the off-time is less than the threshold value; and
the on-time adjusting circuit repeatedly extends the on-time, up to a maximum extended on-time, each time the off-time is detected to be less than the threshold value.

14. The electronic circuit of claim 11, wherein:
the off-time detection circuit detects that the off-time is less than the threshold value by detecting that an on-time start signal indicating a start of the on-time occurs within a predetermined time limit after the minimum off-time limit.

15. The electronic circuit of claim 14, wherein:
the on-time adjusting circuit maintains the extended on-time when the on-time start signal occurs within a second predetermined time limit after the predetermined time limit; and
the on-time adjusting circuit decreases the extended on-time when the on-time start signal occurs after the second predetermined time limit.

16. The electronic circuit of claim 11, wherein:
the off-time detection circuit detects that the off-time is less than the threshold value for a predetermined number of consecutive periods of the PWM signal; and
the on-time adjusting circuit extends the on-time in response to detecting that the off-time is less than the threshold value for the predetermined number of consecutive periods of the PWM signal.

17. The electronic circuit of claim 16, wherein:
the threshold value is a first threshold value;
the off-time detection circuit detects that the off-time is greater than a second threshold value for the predetermined number of consecutive periods of the PWM signal, the second threshold value being greater than the first threshold value; and
the on-time adjusting circuit decreases the extended on-time in response to detecting that the off-time is greater than the second threshold value for the predetermined number of consecutive periods of the PWM signal.

18. The electronic circuit of claim 11, wherein:
for each period of a predetermined number of consecutive periods of the PWM signal:
the off-time detection circuit asserts a previous count-up signal for a previous period in response to detecting that the off-time was less than the threshold value during the previous period;

the off-time detection circuit asserts a current count-up signal in response to detecting that the off-time is less than the threshold value;

the off-time detection circuit asserts a count-okay signal in response to both the previous count-up signal and the current count-up signal being asserted; and the off-time detection circuit increments an output of a period counter in response to the count-okay signal being asserted;

the on-time adjusting circuit detects that the output of the period counter has reached a maximum count value and that the current count-up signal is asserted;

the on-time adjusting circuit increments an output of an up/down counter in response to detecting that the output of the period counter has reached the maximum count value and that the current count-up signal is asserted; and the on-time adjusting circuit extends the on-time based on the output of the up/down counter.

19. The electronic circuit of claim 18, wherein:

the threshold value is a first threshold value;

for each period of the predetermined number of consecutive periods of the PWM signal:

the off-time detection circuit asserts a previous count-down signal for the previous period in response to detecting that the off-time was greater than a second threshold value during the previous period, the second threshold value being greater than the first threshold value;

the off-time detection circuit asserts a current count-down signal in response to detecting that the off-time is greater than the second threshold value;

the off-time detection circuit asserts the count-okay signal in response to both the previous count-down signal and the current count-down signal being asserted; and the off-time detection circuit increments the output of the period counter in response to the count-okay signal being asserted;

the on-time adjusting circuit detects that the output of the period counter has reached the maximum count value and that the current count-up signal is not asserted;

the on-time adjusting circuit decrements the output of the up/down counter in response to detecting that the output of the period counter has reached the maximum count value and that the current count-up signal is not asserted; and the on-time adjusting circuit decreases the extended on-time based on the output of the up/down counter.

20. The electronic circuit of claim 19, wherein:

for each period of the predetermined number of consecutive periods of the PWM signal:

the off-time detection circuit de-asserts the count-okay signal in response to 1) the current count-up signal being different from the previous count-up signal, 2) the current count-down signal being different from the previous count-down signal, or 3) both the current count-up signal and the current count-down signal being de-asserted; and the off-time detection circuit resets the output of the period counter in response to the count-okay signal being de-asserted.

* * * * *